US012627282B2

(12) United States Patent
Lan

(10) Patent No.: US 12,627,282 B2
(45) Date of Patent: May 12, 2026

(54) MICROCONTROLLER AND CONTROL DEVICE

(71) Applicant: Nuvoton Technology Corporation, Hsinchu Science Park (TW)

(72) Inventor: Yung-Chi Lan, Taichung (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 18/971,202

(22) Filed: Dec. 6, 2024

(65) Prior Publication Data

US 2025/0211208 A1     Jun. 26, 2025

(30) Foreign Application Priority Data

Dec. 22, 2023    (TW) ................................. 112150258

(51) Int. Cl.
H03K 3/014 (2006.01)
G06F 1/04 (2006.01)
H03L 3/00 (2006.01)

(52) U.S. Cl.
CPC .............. H03K 3/014 (2013.01); G06F 1/04 (2013.01); H03L 3/00 (2013.01)

(58) Field of Classification Search
CPC ..... G06F 1/08; G06F 1/12; G06F 1/24; G06F 1/3237; G06F 1/04; H03K 19/096; H03K 3/014; H03L 3/00
See application file for complete search history.

(56) References Cited

U.S. PATENT DOCUMENTS

2004/0164814 A1* 8/2004 Misawa ............... H03K 3/0307
331/176
2022/0247411 A1* 8/2022 Lan ........................... H03L 7/00

FOREIGN PATENT DOCUMENTS

CN          116126116 A     5/2023

* cited by examiner

*Primary Examiner* — Ryan Johnson
(74) *Attorney, Agent, or Firm* — MUNCY, GEISSLER, OLDS & LOWE, P.C.

(57) ABSTRACT

A control device coupled to an oscillator circuit and including a first output circuit, a synchronizer circuit, a hysteresis circuit, a stable circuit, and a second output circuit is provided. The first output circuit activates an oscillator circuit according to an activation signal so that the oscillator circuit generates an input clock. The synchronizer circuit synchronizes the activation signal to generate a synchronization signal. The synchronization signal is synchronized with the input clock. The hysteresis circuit directs the first output circuit to disable the oscillator circuit according to the synchronization signal. The stable circuit enables a transmission signal according to the input clock. When the transmission signal is enabled, the second output circuit uses the input clock as an output clock.

20 Claims, 7 Drawing Sheets

100

MICROCONTROLLER AND CONTROL DEVICE

CROSS REFERENCE TO RELATED APPLICATIONS

This application claims priority of Taiwan Patent Application No. 112150258, filed on Dec. 22, 2023, the entirety of which is incorporated by reference herein.

BACKGROUND OF THE INVENTION

Field of the Invention

The present invention relates to a control device, and, in particular, to a control device that controls oscillator circuits.

Description of the Related Art

Digital circuits require a clock signal as a driving source, and the clock signal is usually generated by an analog circuit. When the analog circuit is first turned on, the clock signal provided by the analog circuit is not yet stable. If an unstable clock signal is directly provided to the digital circuit, it will cause the digital circuit to malfunction. Furthermore, the analog circuit usually starts to generate a clock signal according to a driving signal. When the driving signal has glitches or experiences noise interference, the analog circuit may be turned off so that it is unable to provide clock signals to the digital circuit.

BRIEF SUMMARY OF THE INVENTION

In accordance with an embodiment of the disclosure, a control device is coupled to an oscillator circuit and comprises a first output circuit, a synchronizer circuit, a hysteresis circuit, a stable circuit, and a second output circuit. The first output circuit enables a driving signal in response a first activation signal being at a first level, and disables the driving signal in response to a first clear signal being enabled. The synchronizer circuit synchronizes the first activation signal to generate a synchronization signal. The synchronization signal is synchronized with an input clock. The hysteresis circuit enables the first clear signal in response to the level of the synchronization signal matching a first predetermined state, and enables a second clear signal in response to the level of the synchronization signal matching a second predetermined state. The stable circuit enables a transmission signal according to the input clock. The second output circuit uses the input clock as a first output clock in response to the transmission signal being enabled, and stopping the use of the input clock as the first output clock in response to the second clear signal being enabled. In response to the driving signal being enabled, the oscillator circuit provides the input clock. In response to the driving signal being disabled, the oscillator circuit stops providing the input clock.

In accordance with another embodiment of the disclosure, a microcontroller circuit comprises an oscillator circuit and a control device. The oscillator circuit provides an input clock in response to a driving signal being enabled. In response to the driving signal being disabled, the oscillator circuit stops providing the input clock. The control device is coupled to the oscillator circuit and comprises a first output circuit, a synchronizer circuit, a hysteresis circuit, a stable circuit, a second output circuit. The first output circuit enables the driving signal in response to a first activation signal being at a first level and disables the driving signal in response to a first clear signal being enabled. The synchronizer circuit synchronizes the first activation signal to generate a synchronization signal. The synchronization signal is synchronized with the input clock. The hysteresis circuit enables the first clear signal in response to the level of the synchronization signal matching a first predetermined state, and enables a second clear signal in response to the level of the synchronization signal matching a second predetermined state. The stable circuit enables a transmission signal according to the input clock. The second output circuit uses the input clock as a first output clock in response to the transmission signal being enabled, and stops using the input clock as the first output clock in response to the second clear signal being enabled.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
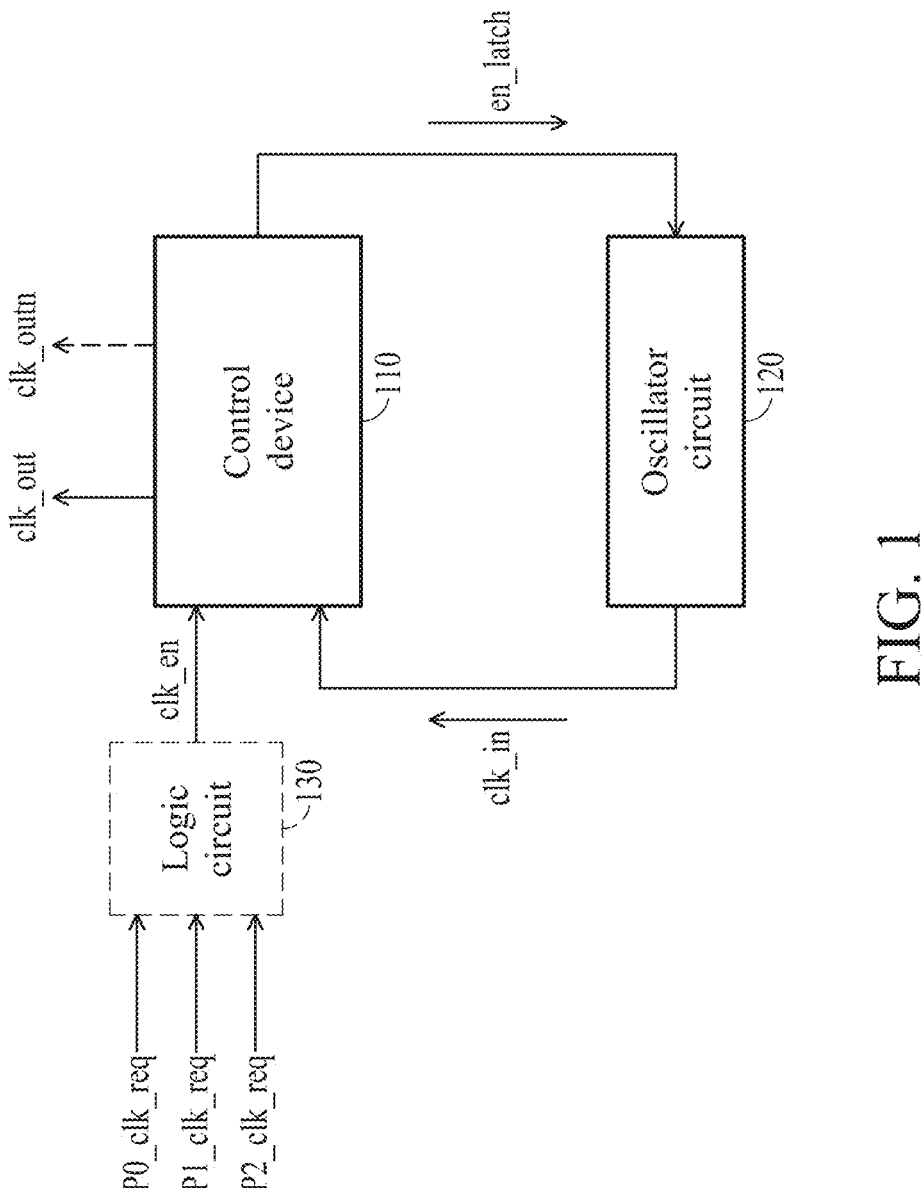
FIG. 1 is a schematic diagram of an exemplary embodiment of a microcontroller circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a microcontroller circuit according to various aspects of the present disclosure. As shown in FIG. 1, the microcontroller circuit 100 comprises a control device 110 and an oscillator circuit 120. The control device 110 is coupled to the oscillator circuit 120 and generates a driving signal en_latch according to an activation signal clk_en (also referred to as a first activation signal). In one embodiment, when the activation signal clk_en is enabled, the control device 110 enables the driving signal en_latch. When the activation signal clk_en is disabled, the control device 110 disables the driving signal en_latch.

Additionally, the control device 110 generates an output clock clk_out according to an input clock clk_in. In one embodiment, after the input clock clk_in is stabilized, the control device 110 uses the input clock clk_in as the output clock clk_out. In another embodiment, the control device 110 uses the inverted signal which is opposite to the input clock clk_in as the output clock clk_out. The number of output clocks is not limited in the present disclosure. In some embodiments, the control device 110 further generates an output clock clk_outn. The phases of the output clock clk_outn are inverted to the phase of the output clock clk_out.

In other embodiments, when the activation signal clk_en is enabled, the control device 110 sets the output clock clk_out so that it is equal to the inverted signal which is opposite to the input clock clk_in and sets the output clock clk_outn so that it is equal to the input clock clk_in. In this case, when the activation signal clk_en is disabled, the control device 110 sets the output clocks clk_out and clk_outn so that they are equal to a specific level, such as a low level.

The oscillator circuit 120 generates the input clock clk_in according to the driving signal en_latch. For example, when the driving signal en_latch is enabled, the oscillator circuit 120 provides the input clock clk_in. When the driving signal en_latch is disabled, the oscillator circuit 120 stops providing the input clock clk_in. In this embodiment, there is no glitch in the driving signal en_latch provided by the control device 110. Therefore, the operation of the oscillator circuit 120 is normal because there is no glitches in the driving signal en_latch. The oscillator circuit 120 works normally. The structure of oscillator circuit 120 is not limited in the present disclosure. In one embodiment, the oscillator circuit 120 is a resistor-capacitor (RC) oscillator.

The source of activation signal clk_en is not limited in the present disclosure. In other embodiments, the microcontroller circuit 100 further comprises a logic circuit 130. The logic circuit 130 generates the activation signal clk_en according to clock requirements IP0_clk_req, IP1_clk_req, and IP2_clk_req. For example, when one of the clock requirements IP0_clk_req, IP1_clk_req, and IP2_clk_req is enabled, the logic circuit 130 enables the activation signal clk_en. When the clock requirements IP0_clk_req, IP1_clk_req, and IP2_clk_req are disabled, the logic circuit 130 disables the activation signal clk_en. The structure of logic circuit 130 is not limited in the present disclosure. In one embodiment, the logic circuit 130 is an OR gate.

The sources of clock requirements IP0_clk_req, IP1_clk_req, and IP2_clk_req are not limited in the present disclosure. In one embodiment, the clock requirements IP0_clk_req, IP1_clk_req, and IP2_clk_req are provided by different devices (IPs). For example, when a first specific device (not shown) needs the output clock clk_out, the first specific device enables the clock requirement IP0_clk_req. Therefore, the logic circuit 130 enables the activation signal clk_en to direct the control device 110 to generate the output clock clk_out. In this case, when the first specific device does not need the output clock clk_out, the first specific device disables the clock requirement IP0_clk_req. At this time, if the clock requirements IP1_clk_req and IP2_clk_req are disabled, the logic circuit 130 disables the activation signal clk_en. However, if the clock requirement IP1_clk_req or the clock requirement IP2_clk_req is enabled, this means that the other specific device needs the output clock clk_out. Therefore, the logic circuit 130 continues to enable the activation signal clk_en.

Figure 2:
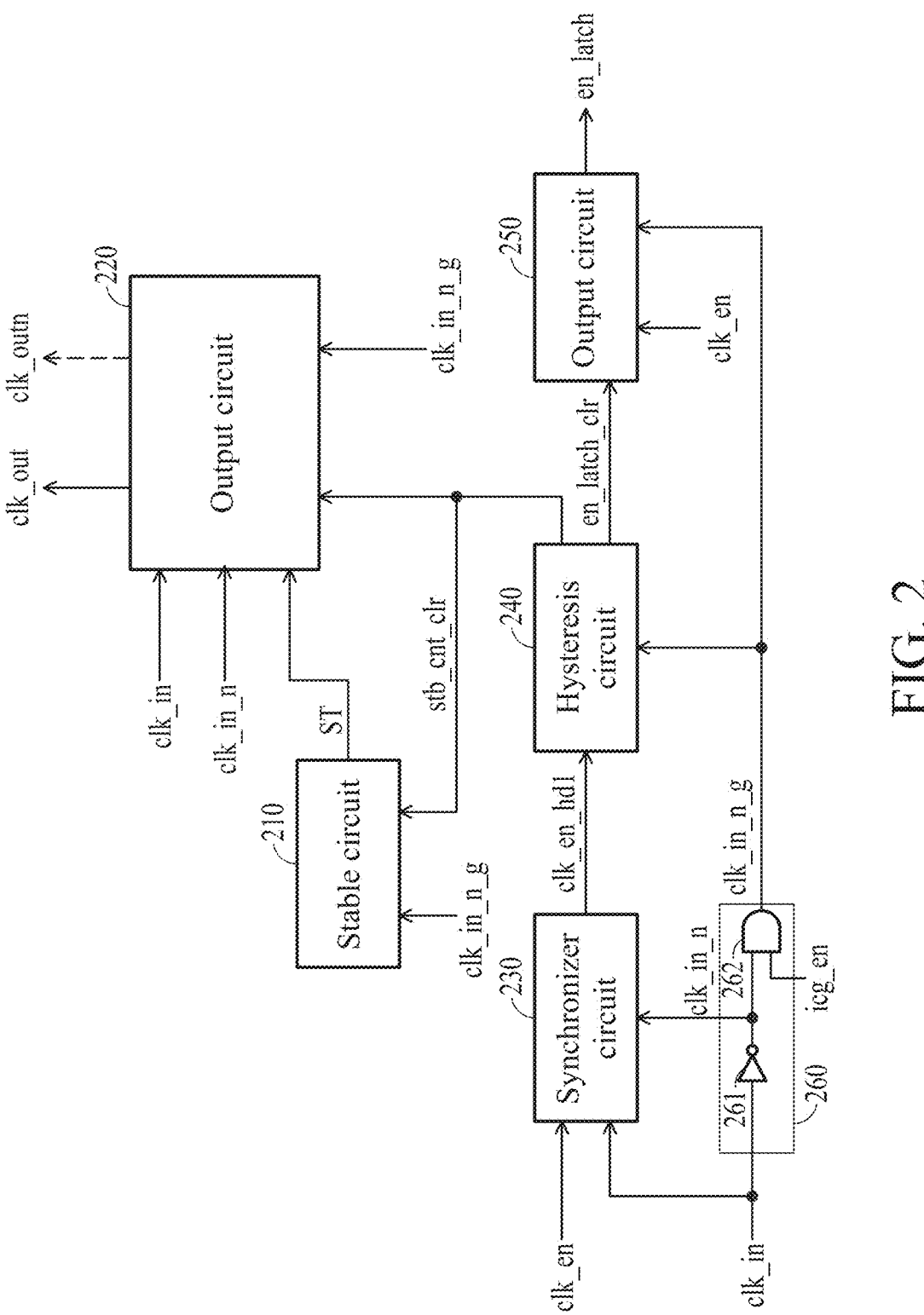
FIG. 2 is a schematic diagram of an exemplary embodiment of a control device according to various aspects of the present disclosure.

FIG. 2 is a schematic diagram of an exemplary embodiment of a control device according to various aspects of the present disclosure. As shown in FIG. 2, the control device 110 comprises a stable circuit 210, output circuits 220 and 250, a synchronizer circuit 230, and a hysteresis circuit 240. The stable circuit 210 adjusts a counted value according to the input clock clk_in. When the counted value reaches a target value, this means that the input clock clk_in is stabilized. Therefore, the stable circuit 210 notifies the output circuit 220. In some embodiments, if the target value is small, the output circuit 220 provides the output clock clk_out to the external load faster. However, if the external load requires a more accurate output clock clk_out, the target value needs to be increased In this embodiment, the stable circuit 210 enables a transmission signal ST according to a clear signal stb_cnt_clr and a gating clock signal clk_in_n_g. In one embodiment, the stable circuit 210 performs a counting operation. Since the gating clock signal clk_in_n_g is related to the input clock clk_in, it is equivalent to the stable circuit 210 performing a counting operation according to the input clock clk_in. When the counted value of the stable circuit 210 reaches a target value, the stable circuit 210 enables the transmission signal ST to notify the output circuit 220 to provide the output clock clk_out. In one embodiment, when the clear signal stb_cnt_clr is enabled, it means that the activation signal clk_en is disabled. Therefore, the stable circuit 210 resets its own counted value.

The output circuit 220 is configured to provide the output clock clk_out. In other embodiment, the output circuit 220 further provides another output clock clk_outn. When the phase of the output clock clk_out is inverse to the phase of the output clock clk_outn, the output clocks clk_out and clk_outn can be applied to devices that are triggered by positive edge and negative edge.

In some embodiments, the output circuit 220 uses an inverted signal clk_in_n (also referred to as a first inverted signal) as the output clock clk_out and uses the input clock clk_in as the output clock clk_outn. In this embodiment, the phase of the inverted signal clk_in_n is inverse to the phase of the input clock clk_in. when the activation signal clk_en is disabled, the output clocks clk_out and clk_outn are at the same level, such as a low level. For a retention D-type flip-flop manufactured by an advanced process, when the retention D-type flip-flop is performing a restore operation, the clock terminal of the retention D-type flip-flop needs to be at a low level. Since the output clocks clk_out and clk_outn may stay at a low level at the same time, the output clocks clk_out and clk_outn can be applied in the maintaining D-type flip-flop.

In this embodiment, the output circuit 220 receives the clear signal stb_cnt_clr, the gating clock signal clk_in_n_g, and the transmission signal ST. When the transmission signal ST is enabled, it means that the input clock clk_in is stabilized. Therefore, the output circuit 220 uses the inverted signal clk_in_n or the input clock clk_in as the output clock clk_out. When the clear signal stb_cnt_clr is enabled, it means that the activation signal clk_en is disable. Therefore, the output circuit 220 stops using the inverted signal clk_in_n or the input clock clk_in as the output clock clk_out. At this time, the output clock clk_out may be at a low level.

In other embodiments, the output circuit 220 further provides the output clock clk_outn. When the transmission signal ST is enabled, the output circuit 220 uses the inverted signal clk_in_n as the output clock clk_out and uses the input clock clk_in as the output clock clk_outn. In another embodiment, when the transmission signal ST is enabled, the output signal 220 uses the input clock clk_in as the output clock clk_out and uses the inverted signal clk_in_n as the output clock clk_outn.

The synchronizer circuit 230 synchronizes the activation signal clk_en to generate a synchronization signal clk_en_hd1. The synchronization signal clk_en_hd1 is synchronized with the input clock clk_in. In some embodiments, the activation signal clk_en and the input clock clk_in may be applied in different domains. When the control device 110 uses the activation signal clk_en and the input clock clk_in, since the transition time of the activation signal clk_en may be very close to the transition time of the input clock clk_in, the output clock clk_out is in a metastable state. However, since the synchronizer circuit 230 adjusts the level change time of the activation signal clk_en so that the activation signal clk_en is synchronized with the input clock clk_in. Therefore, the output clock clk_out can be prevented from being in a metastable state.

In other embodiments, the control device 110 further comprises a process circuit 260. The process circuit 260 may be integrated into the synchronizer circuit 230 or independent of the synchronizer circuit 230. The process circuit 260 processes the input clock clk_in to generate the inverted signal clk_in_n (referred to as a first inverted signal) and generates the gating clock signal clk_in_n_g according to a control signal icg_en.

In one embodiment, the process circuit 260 comprises an inverter 261 and an integrated clock gating cell 262. The inverter 261 inverts the input clock clk_in to generate the inverted signal clk_in_n. In one embodiment, the synchronizer circuit 230 generates the synchronization signal clk_en_hd1 according to the input clock clk_in, the inverted signal clk_in_n, and the activation signal clk_en. In another embodiment, the inverter 261 can be omitted. When the inverter 261 is omitted, the synchronizer circuit 230 generates the synchronization signal clk_en_hd1 according to the input clock clk_in and the activation signal clk_en.

The integrated clock gating cell 262 generates the gating clock signal clk_in_n_g according to the inverted signal clk_in_n and the control signal icg_en. When the inverter 261 is omitted, the integrated clock gating cell 262 generates the gating clock signal clk_in_n_g according to the input clock clk_in and the control signal icg_en.

Taking the inverted signal clk_in_n as an example, when the control signal icg_en is at a first level (e.g., a high level), the integrated clock gating cell 262 uses the inverted signal clk_in_n as the gating clock signal clk_in_n_g. When the control signal icg_en is at a second level (e.g., a low level), the integrated clock gating cell 262 sets the gating clock signal clk_in_n_g so that it is at the second level.

In this embodiment, the integrated clock gating cell 262 provides the gating clock signal clk_in_n_g to the stable circuit 210, the output circuits 220 and 250, and the hysteresis circuit 240. Therefore, the operations of the stable circuit 210, the output circuits 220 and 250, and the hysteresis circuit 240 are synchronized with the input clock clk_in. Furthermore, when the input clock clk_in is stable, the integrated clock gating cell 262 may set the gating clock signal clk_in_n_g so that it is at the second level. Therefore, the stable circuit 210, the output circuits 220 and 250, and the hysteresis circuit 240 stops working to reduce the power consumption of the control device 110. When the activation signal clk_en is disabled, the integrated clock gating cell 262 uses the inverted signal clk_in_n as the gating clock signal clk_in_n_g. Therefore, the stable circuit 210, the output circuits 220 and 250, and the hysteresis circuit 240 start working.

The hysteresis circuit 240 is configured to determine the duration of the activation signal clk_en being disabled. When the duration of the activation signal clk_en being disabled has not reached a predetermined value, it means that the activation signal clk_en has a short glitch or is affected by noise. Therefore, the hysteresis circuit 240 ignores the level change of the activation signal clk_en and treats the activation signal clk_en as still being enabled.

Additionally, when a first specific device does not need to use the output clock clk_out, the first specific device may disable the clock requirement IP0_clk_req. At this time, the activation signal clk_en may be disabled. However, a second specific device may need to use the output clock clk_out. Therefore, the second specific device enables the clock requirement IP1_clk_req so that the activation signal clk_en is immediately enabled. Since the duration of the activation signal clk_en being disabled does not reach a predetermined value, the hysteresis circuit 240 still regards the activation signal clk_en as being enabled, and does not require the output circuit 220 to stop providing the output clock clk_out, nor require the output circuit 250 to disable the driving signal en_latch. Therefore, the output circuits 220 and 250 are not turned off frequently. Furthermore, after the output circuit 250 is turned off and on again, it takes a stable period of time before the enable driving signal en_latch can be provided again, so that the output circuit 220 can provide the output clock clk_out again. If the output circuits 220 and 250 are frequently switched on and off, not only the power consumption of the control device 110 is increased, but also the efficiency of the external specific device (a device that needs the output clocks clk_out and clk_outn) is greatly reduced because the stable circuit 210 re-counts. Therefore, by appropriately adjusting the predetermined value, the benefits of power saving and high efficiency can be achieved.

In this embodiment, the hysteresis circuit 240 receives the synchronization signal clk_en_hd1 and the gating clock signal clk_in_n_g. When the level of the synchronization signal clk_en_hd1 matches a first predetermined state, it means that the duration of the activation signal clk_en being disabled has reached a predetermined value. Therefore, the hysteresis circuit 240 enables a clear signal en_latch_clr to reset the stable circuit 210 and direct the output circuit 220 to stop providing the output clocks clk_out and clk_outn. At this time, at least one of the output clocks clk_out and clk_outn is at a low level.

When the level of the synchronization signal clk_en_hd1 matches a second predetermined state, the hysteresis circuit 240 enables another clear signal stb_cnt_clr. In this embodiment, the first predetermined state is one in which the duration of the level of the synchronization signal clk_en_hd1 being maintained at a specific level (e.g., a low level) has reached a first predetermined value, and the second predetermined state is one in which the duration of the level of the synchronization signal clk_en_hd1 being maintained at the specific level has reached a second predetermined value. In this case, the second predetermined value is less than the first predetermined value. Therefore, before the clear signal en_latch_clr is enabled, the clear signal stb_cnt_clr is enabled.

The output circuit 250 determines whether to enable the driving signal en_latch according to the activation signal clk_en. After enabling the driving signal en_latch, the output circuit 250 determines whether to disable the driving signal en_latch according to the clear signal en_latch_clr. Therefore, since the clear signal en_latch_clr is synchronized with the input clock clk_in, the metastable phenomena caused by clock domain crossing problems can be avoided.

In this embodiment, the output circuit 250 receives the activation signal clk_en, the clear signal en_latch_clr, and the gating clock signal clk_in_n_g. When the activation signal clk_en is at a specific level (e.g., a high level), the output circuit 250 enables the driving signal en_latch. When the clear signal en_latch_clr is enabled, the output circuit 250 disables the driving signal en_latch. In this embodiment, when the driving signal en_latch is enabled, the driving signal en_latch does not synchronize with the input clock clk_in. When the driving signal en_latch is disabled, the driving signal en_latch and the clear signal en_latch_clr are synchronized with the input clock clk_in.

Figure 3:
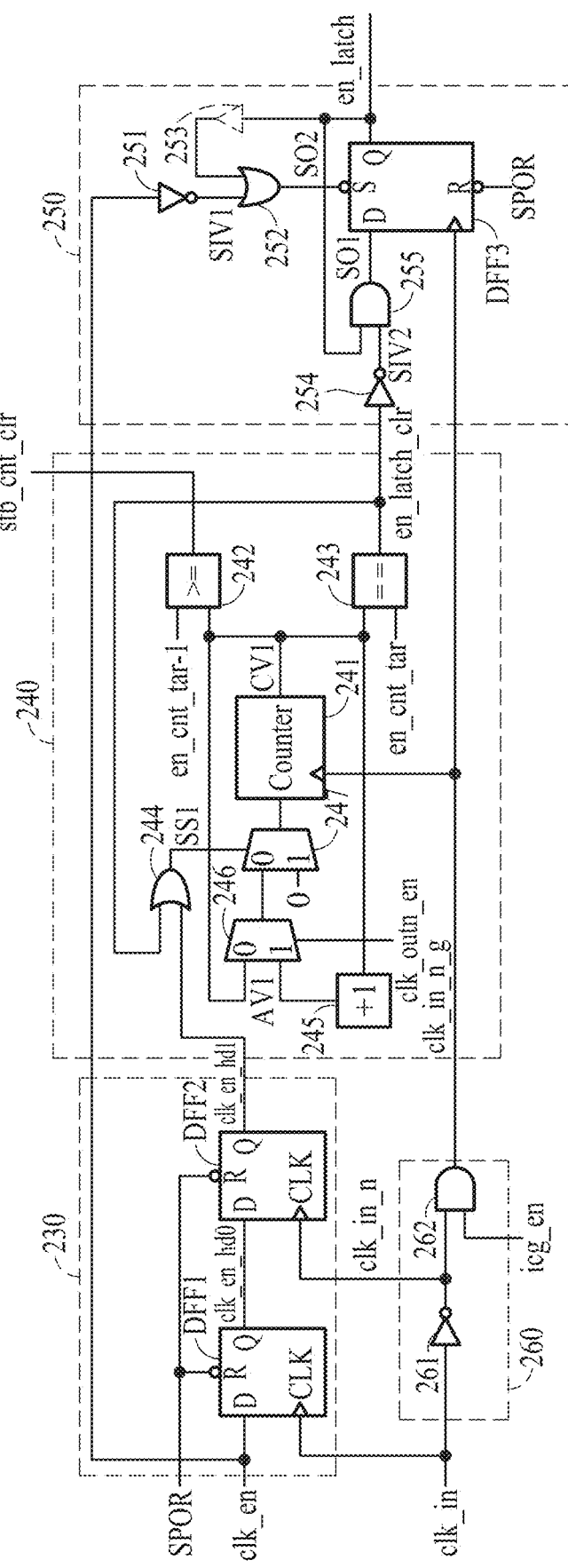
FIG. 3 is a schematic diagram of an exemplary embodiment of a synchronizer circuit, a hysteresis circuit, and an output circuit according to various aspects of the present disclosure.

FIG. 3 is a schematic diagram of an exemplary embodiment of the synchronizer circuit 230, the hysteresis circuit 240, and the output circuit 250 according to various aspects of the present disclosure. In this embodiment, the synchronizer circuit 230 comprises D-type flip-flops DFF1 and DFF2. The input terminal D of the D-type flip-flop DFF1 receives the activation signal clk_en. The clock terminal CLK of the D-type flip-flop DFF1 receives the input clock clk_in. The output terminal Q of the D-type flip-flop DFF1 provides an output signal clk_en_hd0 (also referred to as a first output signal). The input terminal D of the D-type flip-flop DFF2 receives the output signal clk_en_hd0. The clock terminal CLK of the D-type flip-flop DFF2 receives the inverted signal clk_in_n. The output terminal Q of the D-type flip-flop DFF2 provides the synchronization signal clk_en_hd1. In some embodiments, since the clock terminal CLK of the D-type flip-flop DFF2 receives the inverted signal clk_in_n, the speed at which the synchronizer circuit 230 synchronizes the activation signal clk_en can be accelerated.

In other embodiments, the reset terminal R of the D-type flip-flop DFF1 and the reset terminal R of the D-type flip-flop DFF2 receive a power-on reset signal SPOR. When the power-on reset signal SPOR is at a low level, the D-type flip-flop DFF1 resets the output signal clk_en_hd0 and the D-type flip-flop DFF2 resets the synchronization signal clk_en_hd1. At this time, the output signal clk_en_hd0 and the synchronization signal clk_en_hd1 may be at a low level.

The hysteresis circuit 240 comprises a counter 241, comparators 242 and 243. The counter 241 adjusts a counted value CV1 according to the gating clock signal clk_in_n_g. The comparator 243 determines whether the counted value CV1 has reached a predetermined value en_cnt_tar (also referred to as a first predetermined value). When the counted value CV1 reaches the predetermined value en_cnt_tar, the comparator 243 enables the clear signal en_latch_clr. The comparator 242 determines whether the counted value CV1 has reached a predetermined value en_cnt_tar−1 (also referred to as a second predetermined value). When the counted value CV1 reaches the predetermined value en_cnt_tar−1, the comparator 242 enables the clear signal stb_cnt_clr. In this embodiment, the predetermined value en_cnt_tar−1 is less than the predetermined value en_cnt_tar.

In other embodiments, the hysteresis circuit 240 further comprises an OR gate 244, an adder 245, multiplexers 246 and 247. The OR gate 244 provides a selection signal SS1 (also referred to as a first selection signal) according to the clear signal stb_cnt_clr and the synchronization signal clk_en_hd1. The adder 245 adds the counted value CV1 and a predetermined value (e.g., the value 1) to generate an adjustment value AV1. The multiplexer 246 outputs the counted value CV1 or the adjustment value AV1 according to an activation signal clk_outn_en (also referred to as a third activation signal).

The multiplexer 247 outputs the output of the multiplexer 246 or an initial value (e.g., the value 0) to the counter 241 according to the selection signal SS1. The counter 241 sets the counted value CV1 according to the output of the multiplexer 247. For example, when the multiplexer 247 outputs the output of the multiplexer 246, the counter 241 sets the counted value CV1 so that it is equal to the output of the multiplexer 246. When the multiplexer 247 outputs an initial value, the counter 241 sets the counted value CV1 so that it is equal to the initial value.

The output circuit 250 comprises a D-type flip-flop DFF3, an inverter 251, and an OR gate 252. The input terminal D of the D-type flip-flop DFF3 receives an output signal SO1 (also referred to as a second output signal). The clock terminal of D-type flip-flop DFF3 receives the gating clock signal clk_in_n_g. The output terminal Q of the D-type flip-flop DFF3 provides the driving signal en_latch. The setting terminal S of the D-type flip-flop DFF3 receives an output signal SO2 (also referred to as a third output signal). In other embodiments, the reset terminal R of the D-type flip-flop DFF3 receives the power-on reset signal SPOR. When the power-on reset signal SPOR is at a low level, the D-type flip-flop DFF3 resets the driving signal en_latch so that it is at a low level.

The inverter 251 (also referred to as a third inverter) inverts the activation signal clk_en to generate an inverted signal SIV1 (also referred to as a third inverted signal). The OR gate 252 generates the output signal SO2 according to the inverted signal SIV1 and the driving signal en_latch. In one embodiment, the output circuit 250 further comprises a delay element 253. The delay element 253 delays the driving signal en_latch so that the D-type flip-flop DFF3 has enough time to enable the driving signal en_latch. In this case, the OR gate 252 generates the output signal SO2 according to the output of the delay element 253 and the inverted signal SIV1. When the output signal SO2 is at a low level, the D-type flip-flop DFF3 is allowed to enable the driving signal en_latch.

In other embodiments, the output circuit 250 further comprises an inverter 254 and an AND gate 255. The inverter 254 inverts the clear signal en_latch_clr to generate an inverted signal SIV2 (also referred to as a second inverted signal). The AND gate 255 generates the output signal SO1 according to the inverted signal SIV2 and the driving signal en_latch. When the output signal SO1 is at a low level and the level of the gating clock signal clk_in_n_g is changed (e.g., from a low level to a high level), the D-type flip-flop DFF3 sets the driving signal en_latch so that it is at a low level (equivalent to disabling the driving signal en_latch).

When the driving signal en_latch is enabled, the input clock clk_in provided by the oscillator circuit 120 has not yet stabilized, so the D-type flip-flop DFF3 can be allowed to operate according to an asynchronous signal (e.g., the activation signal clk_en). However, after the input clock clk_in provided by the oscillator circuit 120 has stabilized, the D-type flip-flop DFF3 disables the driving signal en_latch according a synchronization signal (e.g., the clear signal en_latch_clr). Therefore, the clock domain crossing (CDC) problems can be avoided.

Additionally, the output circuit 250 disables the driving signal en_latch according to the clear signal en_latch_clr provided by the hysteresis circuit 240. The hysteresis circuit 240 enables the clear signal en_latch_clr when the duration of the activation signal clk_en being at a low level reaches a first predetermined state. Therefore, a high-level glitch on the activation signal clk_en does not accidentally disable the driving signal en_latch.

In other embodiments, after the output circuit 250 enables the driving signal en_latch, the integrated clock gating cell 262 sets the gating clock signal clk_in_n_g so that it is at a low level. Therefore, the hysteresis circuit 240 stops performing the counting operation and the output circuit 250 does not disable the driving signal en_latch to reduce the power consumption of the control device 110.

Figure 4:
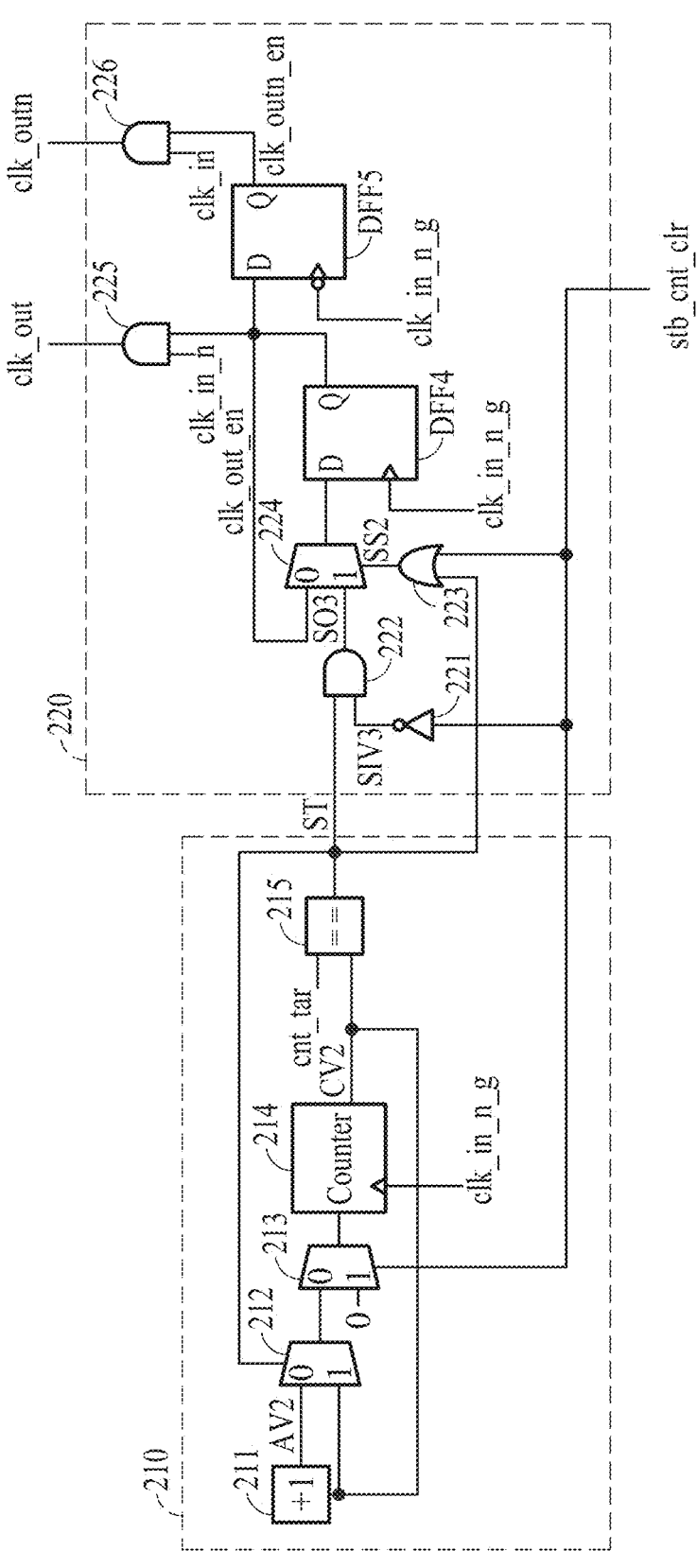
FIG. 4 is a schematic diagram of an exemplary embodiment of a stable circuit and an output circuit according to various aspects of the present disclosure.

FIG. 4 is a schematic diagram of an exemplary embodiment of the stable circuit 210 and the output circuit 220 according to various aspects of the present disclosure. In this embodiment, the stable circuit 210 comprises an adder 211, multiplexers 212 and 213, a counter 214, and a comparator 215. The adder 211 adds the counted value CV2 and a predetermined value (e.g., the value 1) to generate an adjustment value AV2. The multiplexer 212 outputs the adjustment value AV2 or the counted value CV2 according to the transmission signal ST. The multiplexer 213 outputs the output of the multiplexer 212 or an initial value (e.g. the value 0) to the counter 214 according to the clear signal stb_cnt_clr. The counter 214 uses the output of the multiplexer 213 as the counted value CV2 according to the gating clock signal clk_in_n_g. For example, when the multiplexer 213 outputs the output of the multiplexer 212, the counter 214 sets the counted value CV2 so that it is equal to the output of the multiplexer 212. When the multiplexer 213 outputs the initial value, the counter 214 sets the counted value CV2 so that it is equal to the initial value.

The comparator 215 compares the counted value CV2 to a target value cnt_tar. In one embodiment, when the counted value CV2 reaches to the target value cnt_tar, the comparator 215 enables the transmission signal ST, to set the transmission signal ST at a high level, for example. In this case, when the counted value CV2 has not reached the target value cnt_tar, the comparator 215 disables the transmission signal ST, to set the transmission signal ST at a low level, for example.

The output circuit 220 comprises an inverter 221, an AND gate 222, an OR gate 223, a multiplexer 224, a D-type flip-flop DFF4, and an integrated clock gating cell 225. The inverter 221 inverts the clear signal stb_cnt_clr to generate an inverted signal SIV3 (also referred to as a fourth inverted signal). The AND gate 222 generates an output signal SO3 (also referred to a fifth output signal) according to the transmission signal ST and the inverted signal SIV3. The OR gate 223 generates a selection signal SS2 (also referred to as a second selection signal) according to the transmission signal ST and the clear signal stb_cnt_clr. The multiplexer 224 outputs the activation signal clk_out_en (also referred to as a second activation signal) or the output signal SO3 according to the selection signal SS2.

The input terminal D of the D-type flip-flop DFF4 receives the output (also referred to as a fourth output signal) of the multiplexer 224. The clock terminal of the D-type flip-flop DFF4 receives the gating clock signal clk_in_n_g. The output terminal Q of the D-type flip-flop DFF4 provides the activation signal clk_out_en. In some embodiments, the reset terminal (not shown) of the D-type flip-flop DFF4 receives the power-on reset signal SPOR. When the power-on reset signal SPOR is at a low level, the D-type flip-flop DFF4 resets the activation signal clk_out_en to a low level.

The integrated clock gating cell 225 determines whether to use the inverted signal clk_in_n as the output clock clk_out according to the activation signal clk_out_en For example, when the activation signal clk_out_en is at a high level, the integrated clock gating cell 225 uses the inverted signal clk_in_n as the output clock clk_out. When the activation signal clk_out_en is at a low level, the integrated clock gating cell 225 stops using the inverted signal clk_in_n as the output clock clk_out. At this time, the integrated clock gating cell 225 sets the output clock clk_out so that it is at a low level.

In other embodiments, the output circuit 220 further comprises a D-type flip-flop DFF5 and an integrated clock gating cell 226. The input terminal D of the D-type flip-flop DFF5 receives the activation signal clk_out_en. The inverting clock terminal of the D-type flip-flop DFF5 receives the gating clock signal clk_in_n_g. The output terminal Q of the D-type flip-flop DFF5 provides the activation signal clk_outn_en. In some embodiments, the reset terminal (not shown) of the D-type flip-flop DFF5 receives the power-on reset signal SPOR. When the power-on reset signal SPOR is at a low level, the D-type flip-flop DFF5 resets the activation signal clk_outn_en so that it is at a low level.

The integrated clock gating cell 226 determines whether to use the input clock clk_in as the output clock clk_outn according to the activation signal clk_outn_en. Since the operation of the integrated clock gating cell 226 is the same as the operation of the integrated clock gating cell 225, the description of the integrated clock gating cell 226 is omitted.

After the output circuit 220 generates the output clocks clk_out and clk_outn, the integrated clock gating cell 226 sets the gating clock signal clk_in_n_g so that it is at a low level. Therefore, the stable circuit 210 stops performing the counting operation and the D-type flip-flops DFF4 and DFF5 does not change the activation signal clk_out_en and clk_outn_en so that the power consumption can be saved to achieve the purpose of power saving.

Figure 5:
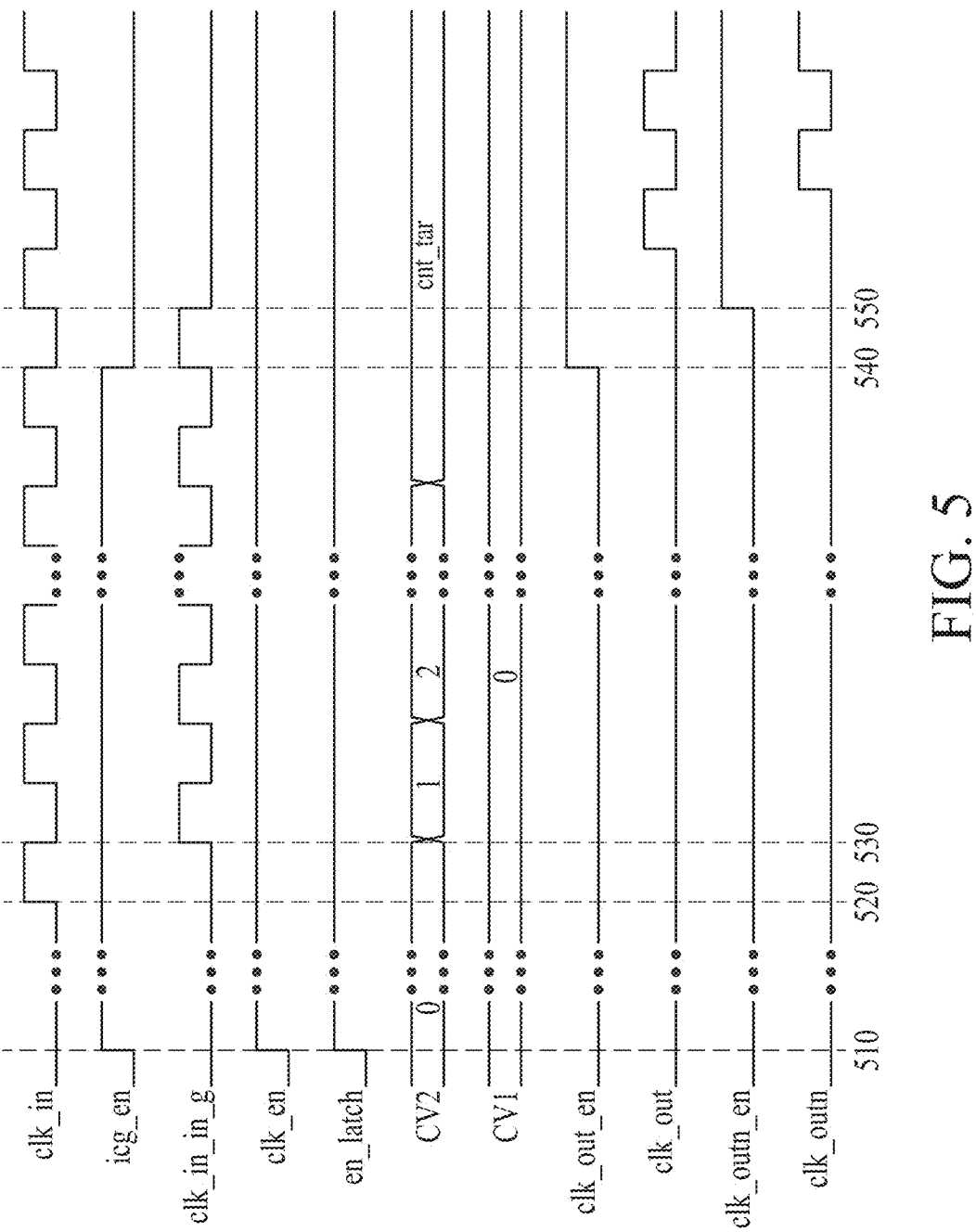
FIG. 5 is a waveform diagram of an exemplary embodiment of a microcontroller circuit when the activation signal is enabled.

FIG. 5 is a waveform diagram of an exemplary embodiment of the microcontroller circuit when the activation signal clk_en is enabled. At time point 510, the activation signal clk_en is enabled to a high level so that the output circuit 250 enables the driving signal en_latch to a high level. Therefore, the oscillator circuit 120 starts generating the input clock clk_in at time point 520.

At time point 530, since the control signal icg_en is at a high level, the integrated clock gating cell 262 of the process circuit 260 uses the inverted signal clk_in_n as the gating clock signal clk_in_n_g. Therefore, the stable circuit 210 starts performing a counting operation.

Figure 6:
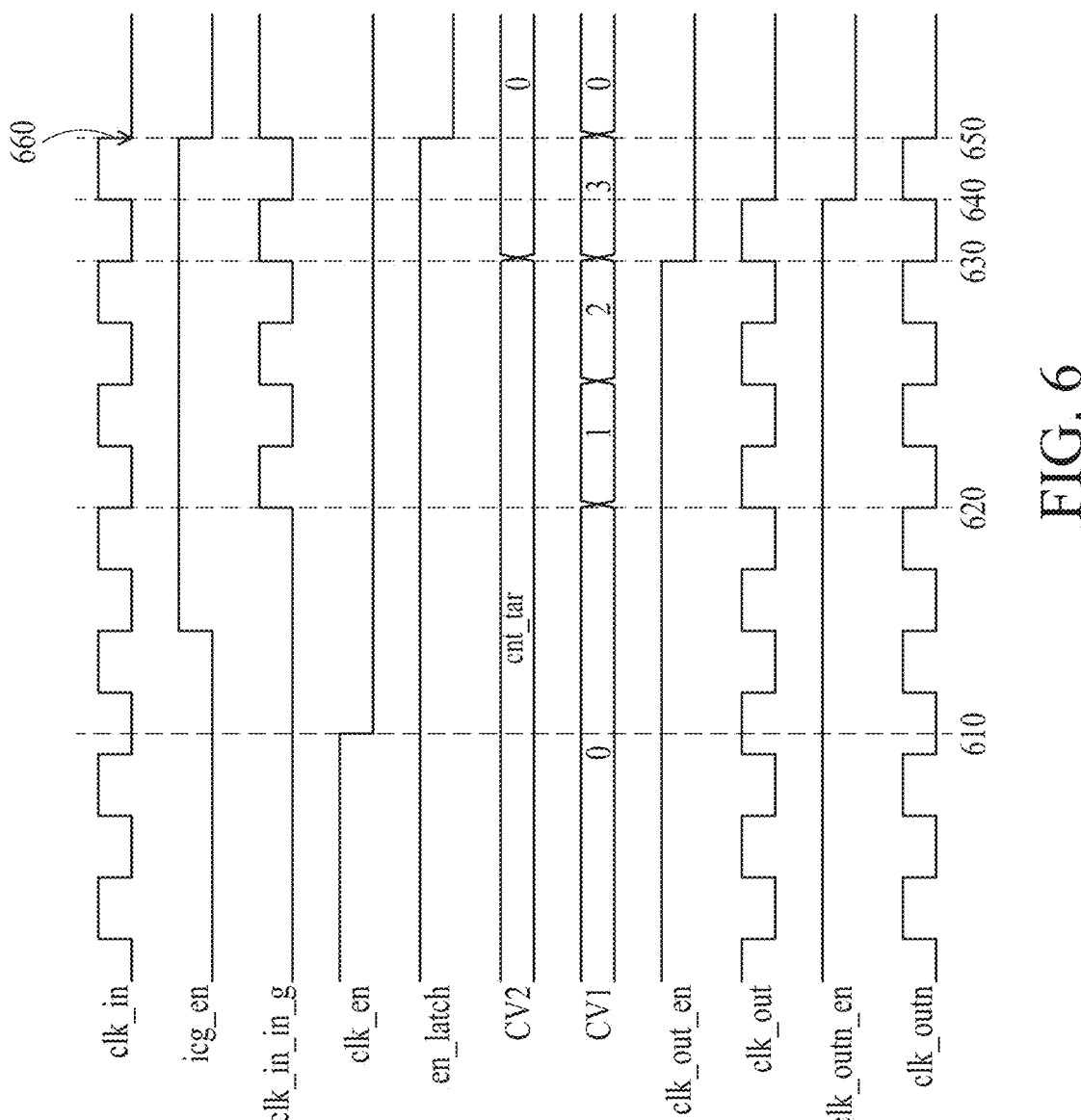
FIG. 6 is a waveform diagram of an exemplary embodiment of the microcontroller circuit when the activation signal is disabled.

At time point 540, the counted value CV2 of the stable circuit 210 reaches a target value cnt_tar so that the transmission signal ST is enabled. The D-type flip-flop DFF4 of the output circuit 220 provides the activation signal clk_out_en which is at a high level. At time point 550, the output circuit 220 uses the inverted signal clk_in_n as the output clock clk_out. Therefore, the phase of the output clock clk_out is opposite to the phase of the input clock clk_in. At this time, the D-type flip-flop DFF5 of the output circuit 220 sets the activation signal clk_outn_en so that it is at a high level. After half a cycle of the input clock clk_in, the output circuit 220 uses the input clock clk_in as the output clock clk_outn FIG. 6 is a waveform diagram of an exemplary embodiment of the microcontroller circuit when the activation signal clk_en is disabled. Before time point 610, the activation signal clk_en is at a high level so that the output circuit 250 enables the driving signal en_latch. Therefore, the oscillator circuit 120 generates the input clock clk_in. At time point 610, the activation signal clk_en is disabled, such as from a high level into a low level.

At time point 620, since the control signal icg_en is at a high level, the hysteresis circuit 240 starts performing a counting operation. Assume that the first predetermined value en_cnt_tar is a value of 3, and the second predetermined value en_cnt_tar−1 is a value of 2 (that is, the first default value minus 1). At time point 630, the counted value CV1 of the hysteresis circuit 240 is equal to 2, reaching the second predetermined value en_cnt_tar−1 so that the clear signal stb_cnt_clr is enabled. Therefore, the D-type flip-flop DFF4 of the output circuit 220 sets the activation signal clk_out_en so that it is at a low level.

At time point 640, the output circuit 220 stops providing the output clock clk_out and sets the output clock clk_out to a low level. At this time, the activation signal clk_outn_en of the output circuit 220 is at a low level.

At time point 650, the output circuit 220 stops providing the output clock clk_outn and sets the output clock clk_outn at a low level. At this time, the counted value of the hysteresis circuit 240 is 3, which means it has reached the first predetermined value en_cnt_tar. Therefore, the clear signal en_latch_clr is enabled. The output circuit 250 sets the driving signal en_latch so that it is at a low level. In this case, when the input clock clk_in is changed from a high level to a low level at the falling edge 660, the output circuit 250 sets the driving signal en_latch so that it is at a low level. Therefore, there is no high level glitch in the driving signal en_latch. In this embodiment, the output clocks clk_out and clk_outn, and the driving signal en_latch are turned off (disabled) in order.

Figure 7:
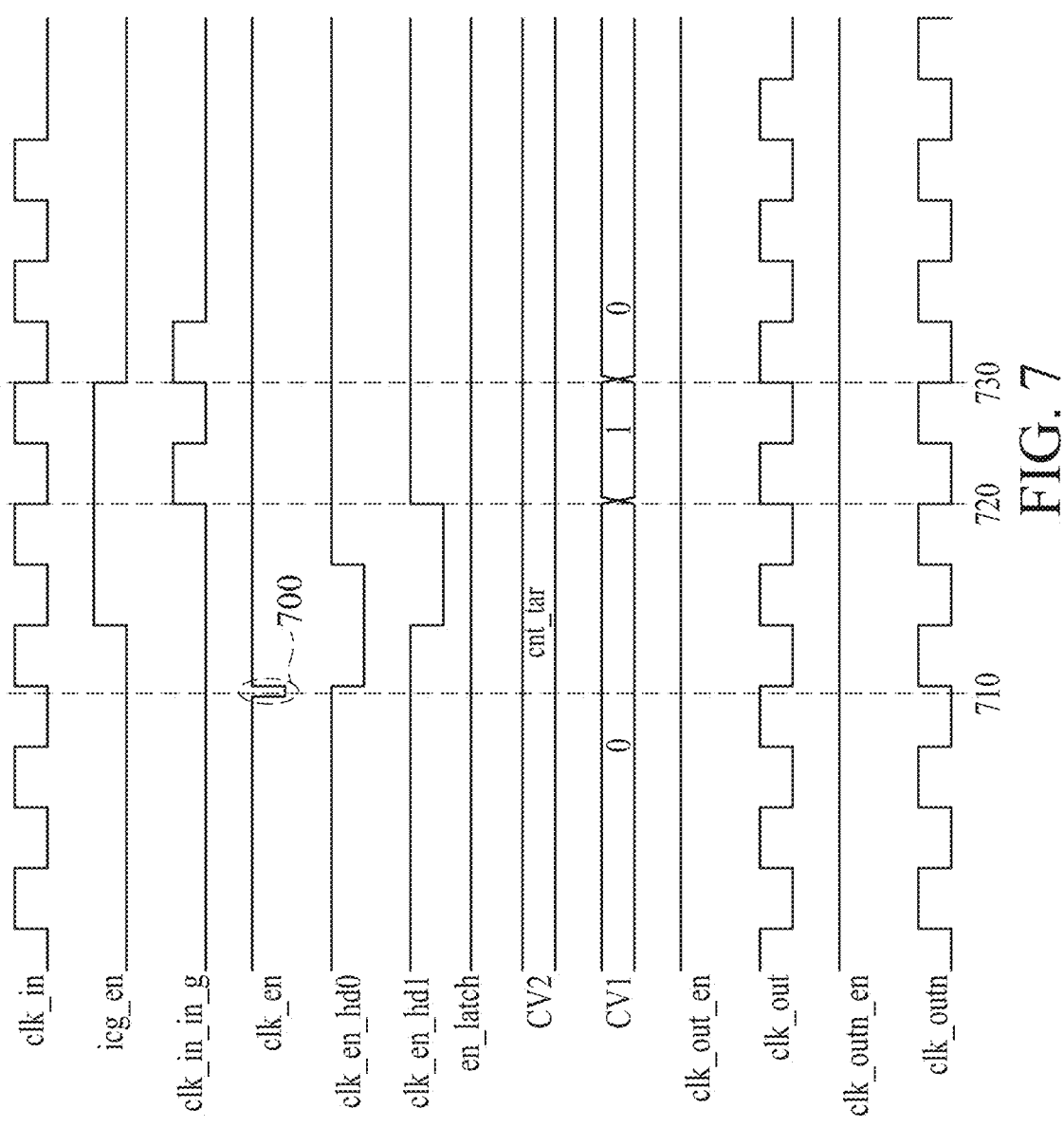
FIG. 7 is a waveform diagram of an exemplary embodiment of the microcontroller circuit receiving an activation signal with low glitch.

FIG. 7 is a waveform diagram of an exemplary embodiment of the microcontroller circuit receiving the activation signal clk_en which has a low glitch. At time point 710, the activation signal clk_en has a low level glitch 700. Therefore, the output signal clk_en_hd0 of the synchronizer circuit 230 is at a low level. After half a cycle, the synchronization signal clk_en_hd1 changes from a high level to a low level.

At time point 720, since the activation signal clk_outn_en is at a high level, the hysteresis circuit 240 starts to count. At time point 730, since the synchronization signal clk_en_hd1 is at a high level, the hysteresis circuit 240 stops counting. The hysteresis circuit 240 resets the counted value. Since the counted value CV1 of the hysteresis circuit 240 has not reached the predetermined value en_cnt_tar, the hysteresis circuit 240 disables the clear signal en_latch_clr. Therefore, the output circuit 250 continuously enables the driving signal en_latch and provides the output clocks clk_out and clk_outn. Since the hysteresis circuit 240 detects the duration during which the activation signal clk_en is disabled, the output circuit 250 does not be turned on and off frequently so that the efficiency of the microcontroller circuit 100 is greatly improved.

It will be understood that when an element or layer is referred to as being "on", "connected to" or "coupled to" another element or layer, it can be directly on, connected or coupled to the other element or layer or intervening elements or layers may be present. In contrast, when an element or layer is referred to as be "directly on", "directly connected to" or "directly coupled to" another element or layer, there are no intervening elements or layers present. Additionally, "enable" shall mean changing the state of a Boolean signal. Boolean signals may be enabled high or with a higher voltage, and Boolean signals may be enabled low or with a lower voltage, at the discretion of the circuit designer. Similarly, "disable" shall mean changing the state of the Boolean signal to a voltage level opposite the enabled state.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control device coupled to an oscillator circuit, comprising:
   a first output circuit enabling a driving signal in response a first activation signal being at a first level, and disabling the driving signal in response to a first clear signal being enabled;
   a synchronizer circuit synchronizing the first activation signal to generate a synchronization signal, wherein the synchronization signal is synchronized with an input clock;
   a hysteresis circuit enabling the first clear signal in response to a level of the synchronization signal matching a first predetermined state, and enabling a second clear signal in response to the level of the synchronization signal matching a second predetermined state;
   a stable circuit enabling a transmission signal according to the input clock; and
   a second output circuit using the input clock as a first output clock in response to the transmission signal being enabled, and stopping the use of the input clock as the first output clock in response to the second clear signal being enabled,
   wherein:
   in response to the driving signal being enabled, the oscillator circuit provides the input clock, and
   in response to the driving signal being disabled, the oscillator circuit stops providing the input clock.

2. The control device as claimed in claim 1, wherein the synchronizer circuit comprises:
   a first D-type flip-flop comprising:
      a first input terminal receiving the first activation signal;
      a first output terminal providing a first output signal; and
      a first clock terminal receiving the input clock;
   a second D-type flip-flop comprising:
      a second input terminal receiving the first output signal;
      a second output terminal providing the synchronization signal; and
      a second clock terminal receiving a first inverted signal;

a first inverter inverting the input clock to generate the first inverted signal;

a first integrated clock gating cell determining whether to use the first inverted signal as a gating clock signal according to a control signal.

3. The control device as claimed in claim 2, wherein the hysteresis circuit comprises:

a counter adjusting a counted value according to the gating clock signal;

a first comparator determining whether the counted value has reached a first predetermined value, wherein in response to the counted value reaching the first predetermined value, the first comparator enables the first clear signal;

a second comparator determining whether the counted value has reached a second predetermined value, wherein in response to the counted value reaching the second predetermined value, the second comparator enables the second clear signal, wherein the first predetermined value is higher than the second predetermined value.

4. The control device as claimed in claim 3, wherein in response to the first clear signal being enabled, the counted value is reset to an initial value.

5. The control device as claimed in claim 2, wherein the first output circuit comprises:

a third D-type flip-flop comprising:

a third input terminal receiving a second output signal;

a third output terminal providing the driving signal;

a third clock terminal receiving the gating clock signal; and a setting terminal receiving a third output signal;

a second inverter inverting the first clear signal to generate a second inverted signal; and a first AND gate generating the second output signal according to the second inverted signal and the driving signal.

6. The control device as claimed in claim 5, wherein the first output circuit further comprises:

a third inverter inverting the first activation signal to generate a third inverted signal;

a delay element delaying the driving signal to generate a delayed signal; and a first OR gate generating the third output signal according to the third inverted signal and the delayed signal.

7. The control device as claimed in claim 5, wherein the second output circuit comprises:

a fourth D-type flip-flop comprising:

a fourth input terminal receiving a fourth output signal;

a fourth output terminal providing a second activation signal;

a fourth clock terminal receiving the gating clock signal;

a fourth inverter inverting the second clear signal to generate a fourth inverted signal;

a second AND gate generating a fifth output signal according to the transmission signal and the fourth inverted signal;

a second OR gate generating a selection signal according to the transmission signal and the second clear signal;

a multiplexer using the second activation signal or the fifth output signal as the fourth output signal according to the selection signal; and a second integrated clock gating cell determining whether to use the first inverted signal as the first output clock according to the second activation signal.

8. The control device as claimed in claim 7, wherein the second output circuit further comprises:

a fifth D-type flip-flop comprising:

a fifth input terminal receiving the second activation signal;

a fifth output terminal providing a third activation signal; and an inverting clock terminal receiving the gating clock signal; and a third integrated clock gating cell determining whether to use the input clock as a second output clock according to the third activation signal, wherein the second output clock is opposite to the first output clock.

9. The control device as claimed in claim 8, wherein in response to the first activation signal being at a second level, the first and second output clocks are maintained at the second level.

10. The control device as claimed in claim 9, wherein:

reset terminals of the first, second, third, fourth, and fifth D-type flip-flops receive a power-on reset signal, in response to the power-on reset signal being enabled, the first output signal, the synchronization signal, the driving signal, the second activation signal, and the third activation signal are at the second level.

11. A microcontroller circuit comprising:

an oscillator circuit providing an input clock in response to a driving signal being enabled, wherein in response to the driving signal being disabled, the oscillator circuit stops providing the input clock; and a control device coupled to the oscillator circuit and comprising:

a first output circuit enabling the driving signal in response to a first activation signal being at a first level and disabling the driving signal in response to a first clear signal being enabled;

a synchronizer circuit synchronizing the first activation signal to generate a synchronization signal, wherein the synchronization signal is synchronized with the input clock;

a hysteresis circuit enabling the first clear signal in response to a level of the synchronization signal matching a first predetermined state, and enabling a second clear signal in response to the level of the synchronization signal matching a second predetermined state;

a stable circuit enabling a transmission signal according to the input clock;

a second output circuit using the input clock as a first output clock in response to the transmission signal being enabled, and stopping the use of the input clock as the first output clock in response to the second clear signal being enabled.

12. The microcontroller circuit as claimed in claim 11, further comprising:

a first inverter inverting the input clock to generate a first inverted signal; and a first integrated clock gating cell using the first inverted signal as a gating clock signal in response to a control signal being at the first level, and setting the gating clock signal so that the gating clock is at a second level in response to the control signal being at the second level, wherein the first integrated clock gating cell provides the gating clock signal to the hysteresis circuit, the first output circuit, the stable circuit, and the second output circuit.

13. The microcontroller circuit as claimed in claim 12, wherein the hysteresis circuit comprises:

a counter adjusting a counted value according to the gating clock signal;

a first comparator determining whether the counted value has reached a first predetermined value, wherein in response to the counted value reaching the second predetermined value, the first comparator enables the first clear signal;

a second comparator determining whether the counted value has reached a second predetermined value, wherein in response to the counted value reaching the second predetermined value, the second comparator enables the second clear signal, wherein the first predetermined value is higher than the second predetermined value.

14. The microcontroller circuit as claimed in claim 13, wherein the hysteresis circuit further comprises:

an adder adding the counted value and a predetermined value to generate an adjustment value;

a first multiplexer outputting the counted value or the adjustment value according to a third activation signal;

a second multiplexer outputting an output of the first multiplexer or an intimal value to the counter according to a first selection signal;

a first OR gate providing the first selection signal according to the first clear signal and the synchronization signal, wherein:

in response to the second multiplexer outputting the output of the first multiplexer, the counter sets the counted value so that the counted value is equal to the output of the first multiplexer, in response to the second multiplexer outputting the initial value, the counter sets the counted value so that the counted value is equal to the initial value.

15. The microcontroller circuit as claimed in claim 14, wherein the synchronizer circuit comprises:

a first D-type flip-flop comprising:

a first input terminal receiving the first activation signal;

a first output terminal providing a first output signal; and a first clock terminal receiving the input clock; and a second D-type flip-flop comprising:

a second input terminal receiving the first output signal;

a second output terminal providing the synchronization signal; and a second clock terminal receiving the first inverted signal.

16. The microcontroller circuit as claimed in claim 14, wherein the first output circuit comprises:

a third D-type flip-flop comprising:

a third input terminal receiving a second output signal;

a third output terminal providing the driving signal;

a third clock terminal receiving the gating clock signal; and a setting terminal receiving a third output signal;

a second inverter inverting the first clear signal to generate a second inverted signal; and a first AND gate generating the second output signal according to the second inverted signal and the driving signal.

17. The microcontroller circuit as claimed in claim 16, wherein the first output circuit further comprises:

a third inverter inverting the first activation signal to generate a third inverted signal; and a first OR gate generating the third output signal according to the third inverted signal and the driving signal.

18. The microcontroller circuit as claimed in claim 17, wherein the second output circuit comprises:

a fourth inverter inverting the second clear signal to generate a fourth inverted signal;

a second AND gate generating a fifth output signal according to the transmission signal and the fourth inverted signal;

a second OR gate generating a second selection signal according to the transmission signal and the second clear signal;

a third multiplexer outputting a second activation signal or the fifth output signal according to the second selection signal; and a fourth D-type flip-flop comprising:

a fourth input terminal receiving an output of the third multiplexer;

a fourth output terminal providing the second activation signal;

a fourth clock terminal receiving the gating clock signal; and a second integrated clock gating cell determining whether to use the first inverted signal as the first output clock according to the second activation signal.

19. The microcontroller circuit as claimed in claim 18, wherein the second output circuit further comprises:

a fifth D-type flip-flop comprising:

a fifth input terminal receiving the second activation signal;

a fifth output terminal providing a third activation signal; and an inverting clock terminal receiving the gating clock signal; and a third integrated clock gating cell determining whether to use the input clock as a second output clock according to the third activation signal, wherein the second output clock is opposite to the first output clock.

20. The microcontroller circuit as claimed in claim 19, wherein in response to the first activation signal being at a second level, the first and second output clocks are maintained at the second level.

* * * * *